US010098245B2

(12) United States Patent
Lin (10) Patent No.: US 10,098,245 B2
(45) Date of Patent: Oct. 9, 2018

(54) DISPLAY ASSEMBLY, ELECTRONIC DEVICE AND METHOD FOR ASSEMBLING THE SAME

(71) Applicant: GUANGDONG OPPO MOBILE TELECOMMUNICATIONS CORP., LTD., Dongguan, Guangdong (CN)

(72) Inventor: Yugui Lin, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/798,744

(22) Filed: Oct. 31, 2017

(65) Prior Publication Data

US 2018/0199447 A1    Jul. 12, 2018

(30) Foreign Application Priority Data

Jan. 9, 2017   (CN) .......................... 2017 1 0013761
Jan. 9, 2017   (CN) ..................... 2017 2 0022968 U (51) Int. Cl.
*H05K 5/00*   (2006.01)
*H05K 5/03*   (2006.01)
(Continued)

(52) U.S. Cl.
CPC .............. *H05K 5/0017* (2013.01); *H05K 5/03* (2013.01); *H05K 7/18* (2013.01); *H05K 13/04* (2013.01);
(Continued)

(58) Field of Classification Search
CPC ... G02F 1/133308; G02F 2001/133311; G02F 2001/133314; G06F 1/1637; G06F 1/1626;
(Continued)

(56) References Cited

U.S. PATENT DOCUMENTS 6,639,635 B2 * 10/2003 Wang ................ G02F 1/133308
349/58
6,654,078 B1 * 11/2003 Kato ................. G02F 1/133308
349/58
(Continued)

FOREIGN PATENT DOCUMENTS

CN     202872874 U   4/2013
CN     105022185 A  11/2015
JP     2008151898 A   7/2008

*Primary Examiner* — Dimary Lopez Cruz
*Assistant Examiner* — Abhishek Rathod
(74) *Attorney, Agent, or Firm* — Ladas & Parry LLP (57) ABSTRACT

A display assembly is provided. The display panel may include a bottom frame, a display panel, a cover plate, a side frame and a connecting member. A bottom surface of the display panel is disposed on one surface of a bottom plate of the bottom frame. A rear surface of the cover plate is attached to a top surface of the display panel. An inner surface of the side frame is disposed opposite to the side surface of the display panel and secured to a side wall of the bottom frame. The connecting member includes an embedded portion and an extension portion. The extension portion extends from the embedded portion and protrudes from the inner surface of the side frame, and disposed between the cover plate and the display panel. An electronic device and a method for assembling the same are also provided.

20 Claims, 5 Drawing Sheets

(51) Int. Cl.
*H05K 13/04* (2006.01)
*H05K 7/18* (2006.01)

(52) U.S. Cl.
CPC ..... *H05K 13/0465* (2013.01); *H05K 13/0469* (2013.01)

(58) Field of Classification Search
CPC ....... G06F 1/1601; G06F 1/1613; H05K 7/18; H05K 13/0465; H05K 13/04; H05K 5/03; H05K 13/0469; H05K 5/0017; H04M 1/0266
See application file for complete search history.

(56) References Cited

U.S. PATENT DOCUMENTS

| | | | |
|---|---|---|---|
| 9,201,459 B2 | 12/2015 | Lee et al. | |
| 2006/0146486 A1* | 7/2006 | Wikstrom | G02F 1/133308 361/679.26 |
| 2007/0229727 A1* | 10/2007 | Yamazaki | G02F 1/133308 349/58 |
| 2008/0165485 A1* | 7/2008 | Zadesky | H04M 1/0252 361/679.02 |
| 2009/0257207 A1* | 10/2009 | Wang | G06F 1/1626 361/752 |
| 2012/0106201 A1* | 5/2012 | Choi | H04M 1/0266 362/632 |
| 2012/0268686 A1 | 10/2012 | Lee et al. | |
| 2012/0281381 A1 | 11/2012 | Sanford et al. | |
| 2014/0002969 A1 | 1/2014 | Hwang | |
| 2015/0185411 A1* | 7/2015 | Ikuta | G02B 6/0086 348/790 |
| 2015/0237746 A1* | 8/2015 | Lee | H05K 5/02 362/97.1 |
| 2016/0187573 A1* | 6/2016 | Kim | G02B 6/0088 362/606 |
| 2016/0274297 A1* | 9/2016 | Ikuta | G02B 6/0081 |
| 2017/0192291 A1* | 7/2017 | Shi | G02F 1/133308 |
| 2018/0017827 A1* | 1/2018 | Kil | G02F 1/133308 |

\* cited by examiner

DISPLAY ASSEMBLY, ELECTRONIC DEVICE AND METHOD FOR ASSEMBLING THE SAME

CROSS-REFERENCE TO RELATED APPLICATION

This application claims priority to a Chinese application No. CN201710013761.4 filed on Jan. 9, 2017, titled "DISPLAY ASSEMBLY, METHOD FOR ASSEMBLING THE SAME, AND ELECTRONIC DEVICE" and Chinese application No. CN201720022968.3 filed on Jan. 9, 2017. The entirety of the above-mentioned applications is hereby incorporated by reference herein.

TECHNICAL FIELD

The present disclosure generally relates to electronic devices, and particularly to a display assembly, an electronic device including the display assembly and a method for assembling the display assembly and the electronic device.

BACKGROUND

With the development of science and technology, electronic devices such as smart phones are widely used in the world.

Screen-to-body ratio is one of the most important aspects of a smart phone, and is used generally to represent a size of a display panel relative to the whole smart phone.

However, the screen-to-body ratio of the smart phone is designed relatively low nowadays. Generally, a low screen-to-body ratio may indicate a small display area, and therefore, resulting in a poor user experience. Therefore, it is desirable to provide a smart phone with high screen-to-body ratio to greatly improve user experience.

SUMMARY

Embodiments described herein relate to a display assembly, an electronic device and a method for assembling the same.

In one embodiment, a display assembly may include a bottom frame, a display panel, a cover plate, a side frame and a connecting member. The bottom frame includes a bottom plate and a side wall extending from the bottom plate. The display panel includes a top surface and a bottom surface, the bottom surface of the display panel is disposed on one surface of the bottom plate of the bottom frame far away from the side wall. The cover plate includes a rear surface, a front surface and a side surface. The side surface is connected between the rear surface and the front surface. The rear surface of the cover plate is attached to the top surface of the display panel. The side frame has an inner surface, and the inner surface of the side frame is disposed opposite to the side surface of the display panel and secured to the side wall of the bottom frame. The connecting member includes an embedded portion and an extension portion extending from the embedded portion. The embedded portion is embedded in the side frame. The extension portion protrudes from the inner surface of the side frame and is disposed between the cover plate and the display panel.

In one embodiment, an electronic device may include a display assembly and a back cover. The back cover is mounted around the periphery of the display assembly. The display assembly includes a bottom frame, a display panel, a cover plate, a side frame and a connecting member. The bottom frame includes a bottom plate and a side wall bending from the bottom plate. The cover plate includes a side surface. The display panel is disposed between the bottom plate and the cover plate. The side frame includes a first portion and a second portion. The first portion is disposed opposite to the side surface of the display panel. The second portion is secured to the side wall of the bottom frame. The connecting member includes an embedded portion and an extension portion extending from the embedded portion. The embedded portion is embedded in the side frame, the extension portion is attached to one surface of the cover plate opposite to the display panel.

In one embodiment, a method for assembling the display assembly may include: providing a cover plate and a side frame embedded with a connecting member, wherein the cover plate includes a rear surface, the connecting member includes an embedded portion and an extension portion extending from the embedded portion, the embedded portion is embedded in the side frame, and the extension portion protrudes from an inner surface of the side frame; attaching the extension portion of the connecting member to the rear surface of the cover plate; providing a display panel having a top surface and a bottom surface; attaching the top surface of the display panel to the rear surface of the cover plate; providing a bottom frame having a bottom plate and side wall; disposing the bottom plate of the bottom frame under the display panel and securing the side wall of the bottom frame to the side frame.

BRIEF DESCRIPTION OF THE DRAWINGS

The accompanying drawings, which are incorporated in and constitute a part of this specification, illustrate exemplary embodiments of the present disclosure, and together with the description, explain the principles of the disclosure.

DETAILED DESCRIPTION OF ILLUSTRATED EMBODIMENTS

To make a better understanding of technical solutions of the present disclosure by those skilled in the art, the technical solutions of embodiments of the present disclosure will be described clearly and completely in combination with the accompanying drawings of the embodiments of the present disclosure. Obviously, the described embodiments are merely a part of embodiments of the present disclosure, and not all the embodiments. All other embodiments acquired by those skilled in the art without creative efforts based on the embodiments of the present disclosure shall fall within the protection scope of the present disclosure.

In the description of the present disclosure, the orientation or positional relationship indicated by the terms "center", "up", "down", "front", "rear", "left", "right", "vertical", "horizontal", "top", "bottom", "inside", "outside", "inner", "outer" and the like, is based on the orientation or positional relationship illustrated in the drawings and merely for the purpose of facilitating the description of the present disclosure and simplifying description, rather than indicating or implying that the device or element referred to must have a specific orientation or constructed and operated in a particular orientation, and therefore, should not be construed as limiting the present disclosure.

Terms "first", "second" and so on used in the specification, appended claims, and accompanying drawings of the present disclosure are used to distinguish different objects rather than describe specific sequences. The terms "a number of" or "multiple" means two or more than two.

In the description of the present disclosure, it is to be understood that the terms "install", "connect", "couple" should be broadly understood, unless otherwise specified and defined. For example, a connection may be a fixed connection or a removable connection, or an integrally connection. A connection also can be a directly connection or an indirectly connection by intermediate medium. The specific meaning of the above-mentioned terms in the present disclosure may be understood by those skilled in the art considering specific circumstances.

Additionally, terms "include", "have", and any deformation thereof are intended to cover non-exclusive inclusion relationship. For example, a process, method, system, product, or device including a series of operations or units is not limited to listed operations or units, and In at least one alternative embodiment, can include operations or units which are not listed, or in at least one alternative embodiment, can further include other inherent operations or units for the process, method, product, or device.

The "embodiments" mentioned herein means that features, structures or features described with reference to the embodiments may be included in at least one embodiment of the disclosure. Phrases appearing at various positions of the specification neither always refer to the same embodiment, nor separate or alternative embodiments that are mutually exclusive with other embodiments. It is explicitly and implicitly understood by those skilled in the art that the embodiments described herein may be combined with other embodiments.

Embodiments of the present disclosure provide a display assembly, an electronic device, and a method for assembly the display assembly.

The electronic devices may be portable electronic devices including, but not limited to, such as cellular telephones, media players, handheld computers (also sometimes called personal digital assistants), wearable smart watches and handheld gaming devices.

Figure 1:
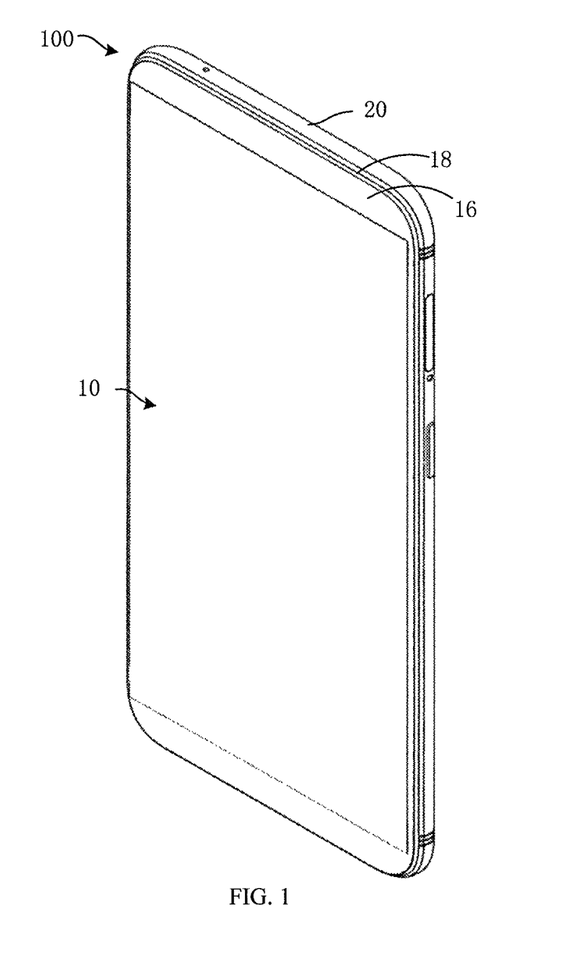
FIG. 1 is a schematic view of an electronic device in accordance with an embodiment of the present disclosure.

An illustrative electronic device in accordance with an embodiment of the present disclosure is shown in FIG. 1. The electronic device illustrated in FIG. 1 may be, for example, a handheld electronic device that supports 2G, 3G or 4G cellular telephone and data functions, global positioning system capabilities or other satellite navigation capabilities. 2G refers to second generation of broadband cellular network technology, 3G refers to third generation and 4G refers to fourth generation. The electronic device may also be a handheld electronic device that supports local wireless communications capabilities (e.g., IEEE 802.11 and Bluetooth®) and that supports handheld computing device functions such as internet browsing, email and calendar functions, games, media player functionality, etc.

The following will specifically illustrate various embodiments respectively.

Figure 2:
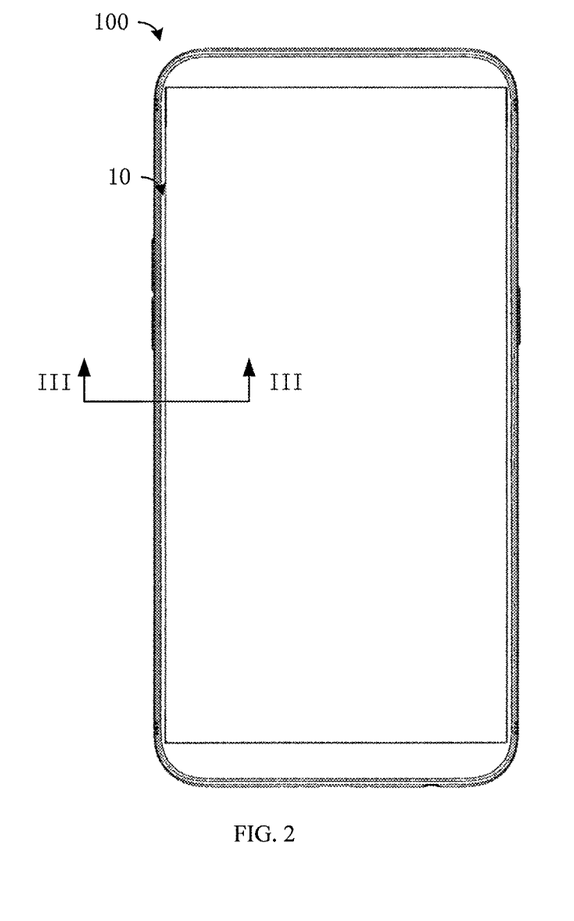
FIG. 2 is a front view of an electronic device in accordance with an embodiment of the present disclosure.

FIG. 1 is a schematic view showing an electronic device in accordance with an embodiment of the present disclosure. FIG. 2 is a front view of the electronic device in FIG. 1.

As illustrated in FIG. 1 and FIG. 2, the electronic device 100 according to the embodiments of the present disclosure includes a display assembly 10 and a back cover 20. The back cover 20 is mounted around the periphery of the display assembly 10. The display assembly 10 is configured to display information such as images, texts and the like. The back cover 20 is protect electronic components mounted in the electronic device 100, such as batteries, circuit boards, etc. The back cover 102 may be made of a material of plastic (i.e. polycarbonate), glass (i.e. aluminosilicate glass), or metal (i.e. stainless steel).

Figure 3:
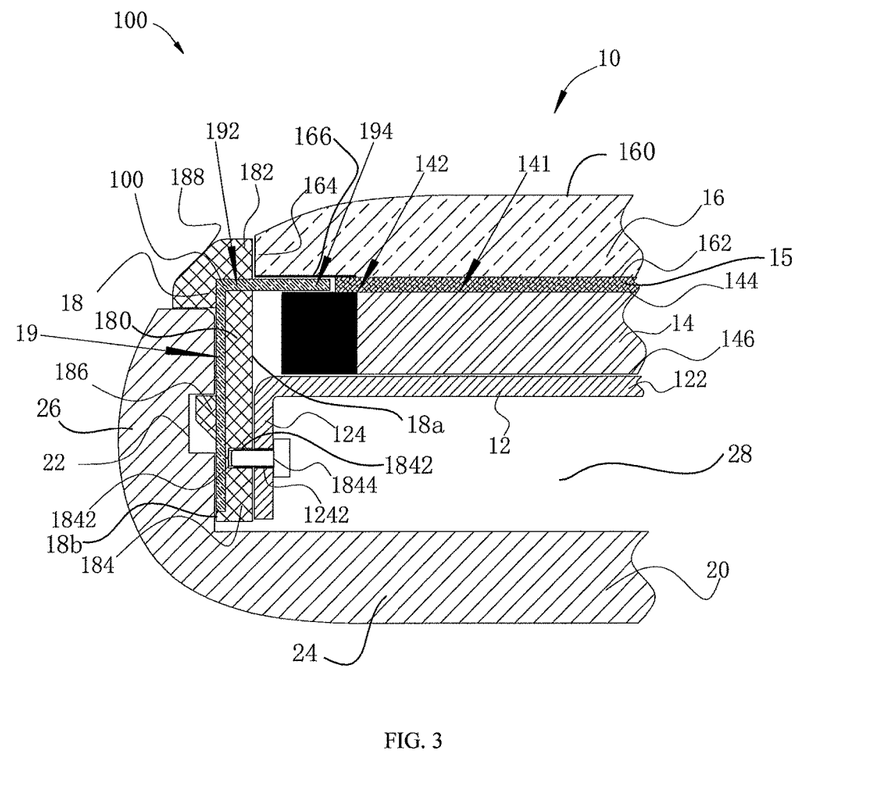
FIG. 3 is a schematic cross-sectional view taken along line in FIG. 2.

As illustrated in FIG. 3, the back cover 20 may include a bottom plate 24 and a side wall 26. The side wall 26 extends from the bottom plate 24. In some embodiment, an inner surface of the side wall 26 is substantially perpendicular to an inner surface of the bottom plate 24. An accommodating space 28 can be formed for accommodating batteries, circuit boards, and at least a part of the display assembly 10. The outer surface of the back cover 20 can be designed according to actual needs. For example, the outer surface of the side wall 26 of the back cover 20 can be in a smooth arc shape.

As illustrated in FIG. 3, the display assembly 10 may include a bottom frame 12, a display panel 14, a cover plate 16, a side frame 18 and a connecting member 19.

In the embodiments of the present disclosure, the bottom frame 12 is configured to support the display panel 14 and the cover plate 16. The display panel 14 and the cover plate 16 are stacked together in a direction substantially perpendicular to a display surface of the display panel 14. The laminated structure of the bottom frame 12, the display panel 14 and the cover plate 16 is mounted to the side frame 18. The connecting member 19 is at least partially embedded in the side frame 18 and extends out of the side frame 18 to a gap between the cover plate 16 and the display panel 14.

The bottom frame 12 may include a bottom plate 122 and a side wall 124 extending from the bottom plate 122. In the exemplary embodiment, the side wall 124 is substantially perpendicular to a peripheral edge of the bottom plate 122.

The side wall 124 of the bottom frame 12 may define a though hole 1242 for connection to the side frame 18.

The bottom frame 12 may be made of metallic material such as steel, aluminum alloy, magnesium alloy. In alternative embodiment, the bottom frame 12 may be made of other suitable material, such as acrylonitrile-butadiene-styrene copolymer (ABS), polyvinyl chloride (PVC) and polycarbonate (PC). The material of the bottom frame 12 is not limited to the above materials, and suitable materials may be selected according to the demand in practical application.

The display panel 14 may be a liquid crystal display (LCD), an organic light-emitting diode (OLED) display or a flexible OLED display. The display panel 14 may be a touch sensitive display panel, which is able to detect the location of a touch input, such as from a finger, other body part, stylus or the like. In some embodiment, the display panel 14 may include a touch sensor, such as a capacitive sensor. For example, the touch sensor may detect a touch location of a touch input to the display panel 14.

The display panel 14 may include a top surface 144 and a bottom surface 146 opposite to the top surface 144. The bottom surface 146 of the display panel 14 is face one surface of the bottom plate 122 of the bottom frame 12 far away from the side wall 124.

In some embodiment, the bottom surface 146 of the display panel 14 may be attached to the bottom plate 122 by an adhesive. For example, the bottom surface 146 of the display panel 14 and the bottom plate 122 may be padded with a layer of a foam adhesive or a double-sided adhesive as desired. In alternative embodiments, a gap may be defined between the bottom surface 146 of the display panel 14 and the bottom plate 122 of the bottom frame 12 to provide a buffer space in the event of a collision, thereby protecting the display panel 14 and extending the service life of the electronic device 100.

As illustrated in FIG. 3, the display panel 14 may include a display area 141 and a non-display area 142 surrounding the display area 141. The display area 141 is configured to display information such as images, texts and the like.

The cover plate 16 may include a front surface 160, a rear surface 162 and a side surface 164. The side surface 164 is connected between the front surface 160 and the rear surface 162. The cover plate 16 is disposed on the display panel 14. The rear surface 162 of the cover plate 16 can be attached to the top surface 144 of the display panel 16. As illustrated in FIG. 3, the rear surface 162 of the cover plate 16 is attached to the top surface 144 of the display panel 14 by an optically clear adhesive (OCA) 15.

A black coating 166 is formed on a peripheral edge of the rear surface 162 of the cover plate 16 by a screen printing method. In the present embodiment, a configuration of the black coating on the rear surface is substantially rectangular. The black coating 166 of the rear surface 162 is configured to shield the non-display area 142 and other internal structures.

The cover plate 16 may be made of a light-transmitting material such as glass, ceramic, sapphire, polyvinyl chloride (PVC) or the like. Since the cover plate 16 is an external component of the electronic device 100, it will be hit or scraped. For example, when the user puts the electronic device 100 into a pocket, the cover plate 16 may be damaged by the key in the pocket. Or when the user performs a gesture operation by fingers on the cover plate 16, the cover plate 16 may be scraped by nails. Thus, the cover plate 16 may be made of a material having a relatively high hardness, such as the sapphire material described above. In some embodiment, a protective plate may be provided one the front surface 160 of the cover plate 16 to prevent the cover plate 16 from being scratched.

In some embodiment, the cover plate 16 may be a touch panel cover, that is, touch lines may be integrated in the cover plate 16. Therefore, clicking or touching on the cover plate 16 can realize the touch function. In some embodiment, the cover plate 16 may include a touch panel and a protective panel provided on the touch panel. The touch panel is configured to realize the touch operation of the display assembly, and the protective panel is configured to protect the touch panel to avoid touching the touch panel directly, which may cause damage to the touch panel.

The side frame 18 is arranged around the side surface 164 of the cover plate 16 and configured to support the bottom frame 12, the display panel 14 and the cover plate 16.

As illustrated in FIG. 3, the side frame 18 may include a support wall 180 and a rim 188 around an upper end of the support wall 180. The support wall 180 includes an inner surface 18a and outer surface 18b.

An end surface of the side frame 18 is exposed outside the electronic device 100, and the other portion of the side frame 18 other than the end surface thereof is a bracket that can be used in the electronic device 100 to support the display panel 14 and the cover plate 16. Thus, the end surface of the side frame 18 can be used as the decorative ring of the electronic device 100, and the decorative ring and the bracket can be joined together by means of an injection molding in a mold to form the side frame 18.

The rim 188 protrudes from the outer surface 18b of the first portion 182 along the direction away from the inner surface 18a. In the illustrated embodiment, the rim 188 of the side frame 18 shields at least part of a top surface of the side wall 26 of the back cover 20. The rim 188 may have a smooth outer surface or a rough surface. The outer surface of the rim 188 and the support wall 180 are together as an end surface of the side frame 18 exposed to the outside. The shape of the outer surface of the rim 188 may have, but not limited to an arc shape. The rim 188 and the support wall 180 may all integrally molded of plastic materials.

The support wall 180 is disposed substantially perpendicular to the display panel 14. In some embodiment, the inner surface 18a is secured to the side surface 164 of the cover plate 16 and the side wall 124 of the bottom frame 12. The outer surface 18b is configured to be coupled to the side wall 26 of the back cover 20.

The support wall 180 includes a first portion 182 and a second portion 184 connected to the first portion 182. The first portion 182 is disposed at a gap defined by the cover plate 16 and the back cover 20 and exposed to the outside of the electronic device 100. The second portion 184 is disposed between the side wall 26 of the back cover 20 and the side wall 124 of the bottom frame 12.

As illustrated in FIG. 3, the inner surface 18a of the first portion 182 may be secured to the side surface 164 of the cover plate 16 by dispensing.

In the illustrated embodiment, the inner surface 18a of the first portion 182 and the side surface 164 of the cover plate 16 are substantially perpendicular to the rear surface 162 of the cover plate 16. In alternative embodiments, the inner surface 18a of the first portion 182 and the side surface 164 of the cover plate 16 may not be perpendicular to the rear surface 162, as long as the inner surface 18a of the first portion 182 and the side surface 164 of the cover plate 16 are substantially parallel to each other.

The second portion 184 of the side frame 18 is secured to the side wall 124 of the bottom frame 12 by any one or a combination of one of a gluing, a threaded connection, an engagement, and a welding method.

In some embodiment, as illustrated in FIG. 3, the second portion 184 defines a threaded hole 1842 in the inner surface 18a. The threaded hole 1842 has a thread in an inner surface thereof. The threaded hole 1842 is at a position corresponding to the through hole 1242 in the side wall 124 of the back cover 12. The second portion 184 is secured to the side wall 124 by a screw 1844. The screw 1844 is inserted into the through hole 1242 and screwed into the threaded hole 1842 in the second portion 184. Thus, the second portion 184 and the side wall 124 can be fastened.

The connecting member 19 may include an embedded portion 192 and an extension portion 194 extending from the embedded portion 192. The embedded portion 192 is partially or wholly embedded in the side frame 18. The extension portion 194 extends from the embedded portion 192 and protrudes from the inner surface 18a of the side frame 18. The extension portion 194 is disposed between the black coating 166 of the cover plate 16 and the non-display area 142 of the display panel 14. That is, the extension portion 194 is arranged between the cover plate 16 and the display panel 14.

In the illustrated embodiment, the embedded portion 192 has an L-shape including a relatively long part and a relatively short part. The relatively long part of the embedded portion 192 is exposed to the outer surface 18*b* of the side frame 18, and the relatively short part of the embedded portion 192 is embedded in the side frame 18. The extension portion 194 extends along the elongated direction of the relatively short part of the embedded portion 192.

The connecting member 19 is embedded in the side frame 18 by means of an in-mold injection molding. Thus, the strength and rigidity of the side of the electronic device 100 is enhanced, and the quality of the product is improved.

In alternative embodiments, the embedded portion 192 may be in other shapes. For example, the embedded portion 192 may have a serrated edge. The embedded portion 192 may completely be embedded in the side frame 18, not exposed from the side frame 18.

The connecting member 19 may be made of a rigid material withstand loads tending to elongate, such as copper, steel, titanium and the like, to improve the hardness of the connecting member 19.

In some embodiment, the extension portion 194 is attached to the rear surface 162 of the cover plate 16 by means of dispensing. The thickness of the extension portion 194 is smaller than the thickness of the optically clear adhesive 15 which is disposed between the rear surface 162 of the cover plate 16 and the top surface 144 of the display panel 14. Therefore, the extension portion 194 is not directly contact with the top surface 144 of the display panel 14 and the connecting member 19 can be prevented from interfering with the display panel 14. In alternative embodiments, a gap may be left between the top surface 144 of the display panel 14 and the extension portion 194 to provide a buffer space in the event of a collision, thereby protecting the display panel 14 and extending the service life of the electronic device 100.

The side frame 18 may further include a protruding block 186. The protruding block 186 protrudes from the outer surface 18*b* of the side frame 18. The inner surface of the side wall 26 defines a recess 22 therein. The protruding block 186 is inserted into the recess 22 thereby the side frame 18 being engaged with the back cover 20. The protruding block 186, the rim 188 and the support wall 180 may all integrally molded of plastic materials.

In the display assembly 10 according to the embodiment of the present disclosure, the connecting member 19 is embedded in the side frame 18, so that the connecting member 19 is integrated with the side frame 18. The first portion 182 of the side frame 18 is secured to the side surface 164 of the cover plate 16 by dispensing. The rear surface 162 of the cover plate 16 is bonded to the top surface 144 of the display panel 14 by the optically clear adhesive 15, so that the display panel 14 is combined with the cover plate 16. The side wall 124 of the bottom frame 12 is fastened to the second portion 184 of the side frame 18, and the bottom surface 146 of the display panel 14 is provided on the bottom plate 122 of the bottom frame 12. In alternative embodiments, the rear surface 162 of the cover plate 16 may first be attached to the top surface 144 of the display panel 14 by the optically clear adhesive 15, and the first portion 182 is then secured to the side surface 164 of the cover plate 16 by dispensing.

In the embodiments of the present disclosure, the strength of the side frame 18 is increased, because the connecting member 19 is completely or partially embedded in the side frame 18 and connects the side frame 18 with the cover plate 16. The black coating 166 of the cover plate 16 can be narrower when the strength of the side frame 18 is increased, so the screen-to-body ratio of the display is increased and the user experience is improved.

Figure 4:
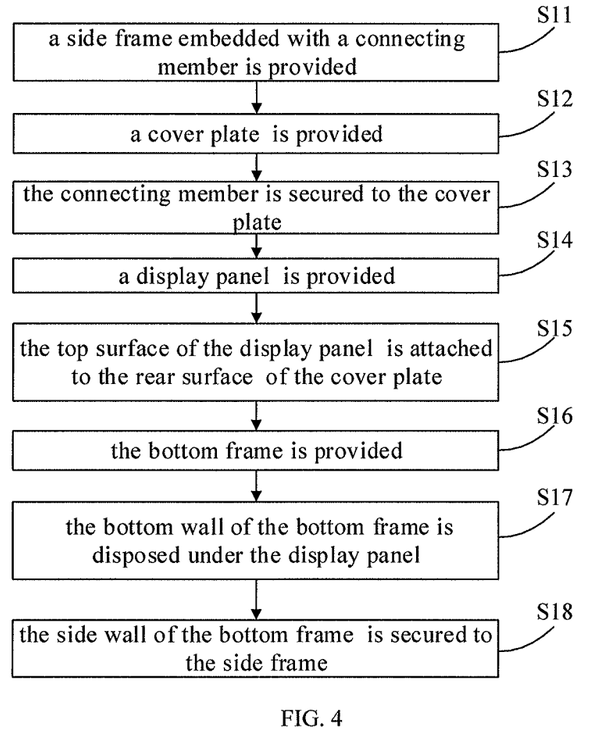
FIG. 4 is a flow chart showing a method for assembling the display assembly in accordance with an embodiment of the present disclosure.

FIG. 4 is a flow chart of a method for assembling the display assembly 10 according to an embodiment of the present disclosure. The method may include the follows.

In block S11, a side frame 18 embedded with a connecting member 19 is provided.

Referring to FIG. 3, the side frame 18 includes the support wall 180 and the rim 188. The support wall 180 includes the first portion 182 and the second portion 184. The embedded portion 192 has an L-shape including a relatively long prat and a relatively short part. The relatively long part of the embedded portion 192 is exposed to the outer surface 18*b* of the side frame 18, and the relatively short part of the embedded portion 192 is embedded in the side frame 18. The extension portion 194 extends along the elongated direction of the relatively short part of the embedded portion 192.

The connecting member 19 may be embedded in the side frame 18 by means of an in-mold injection molding. Thus, the strength and rigidity of the side of the electronic device 100 is enhanced, and the quality of the product is improved.

The connecting member 19 may be made of a rigid material withstand loads tending to elongate, such as copper, steel, titanium and the like, to improve the hardness of the connecting member 19.

In block S12, a cover plate 16 is provided.

The cover plate 16 includes a front surface 160, a rear surface 162 and a side surface 164 connected with the front surface 160 and the rear surface 162. The rear surface 162 of the cover plate 16 can be printed with a circle of black coating 166 at the edges thereof.

In block S13, the connecting member 19 is secured to the cover plate 16.

The extension portion 194 of the connecting member 19 is attached to the cover plate 16. In some embodiment, the extension portion 194 may be attached to the rear surface 162 of the cover plate 16 by means of dispensing. The black coating 166 may shield the extension portion 194 of the connecting member 19.

In block S14, a display panel 14 is provided.

The display panel 14 includes a top surface 144 and a bottom surface 146 opposite to the top surface 144. The display panel 14 may include a display area 141 and a non-display area 142 surrounding the display area 141.

In block S15, the top surface 144 of the display panel 14 is attached to the rear surface 162 of the cover plate 16.

The rear surface 162 of the cover plate 16 may be attached to the top surface 144 of the display panel 14 by an optically clear adhesive 15. The thickness of the optically clear adhesive 15 is greater than the thickness of the extension portion 194. The extension portion 194 is disposed between the black coating 166 of the cover plate 16 and the non-display area 142 of the display panel 14. A gap may be defined between the top surface 144 of the display panel 14 and the extension portion 194 to provide a buffer space in the event of a collision, protecting the display panel 14 and extending the service life of the electronic device 100.

In block S16, the bottom frame 12 is provided.

The bottom frame 12 includes a bottom plate 122 and a side wall 124 extending from the bottom plate 122.

In block S17, the bottom plate 122 of the bottom frame 12 is disposed under the display panel 14.

In block S18, the side wall 124 of the bottom frame 12 is secured to the side frame 18.

The second portion 184 of the side frame 18 is secured to the side wall 124 of the bottom frame 12 by a gluing, a threaded connection, an engagement, a welding method, or a combination of the above method.

In some embodiment, as illustrated in FIG. 3, the second portion 184 defines a threaded hole 1842 in the inner surface 18a, which is provided with a thread. The threaded hole 1842 is at a position corresponding to the through hole 1242 in the side wall 124 of the back cover 12. The second portion 184 is secured to the side wall 124 by a screw 1844. The screw 1844 is inserted into the through hole 1242 and screwed into the threaded hole 1842 in the second portion 184. Thus, the second portion 184 and the side wall 124 can be fastened.

The bottom surface 146 of the display panel 14 is disposed on one surface of the bottom plate 122 of the bottom frame 12 far away from the side wall 124.

In some embodiment, the bottom plate 122 of the bottom frame 12 may be attached to the bottom surface 146 of the display panel 14 by an adhesive. For example, the bottom surface 146 of the display panel 14 and the bottom plate 122 may be padded with a layer of foam adhesive or a double-sided adhesive as desired. In alternative embodiments, a gap may be left between the bottom surface 146 of the display panel 14 and the bottom plate 122 of the bottom frame 12 to provide a buffer space in the event of a collision, protecting the display panel 14 and extending the service life of the electronic device 100.

The sequence of the blocks is not limited. In some embodiment, the above blocks may be sequentially performed in the order of block S11, block S14, block S16, block S17, block S18, block S12, block S13, and block S15. In alternative embodiments, the above blocks also may be sequentially performed in the order of block S16, block S14, block S18, block S11, block S12, block S13, block S15, block S17 or others.

Figure 5:
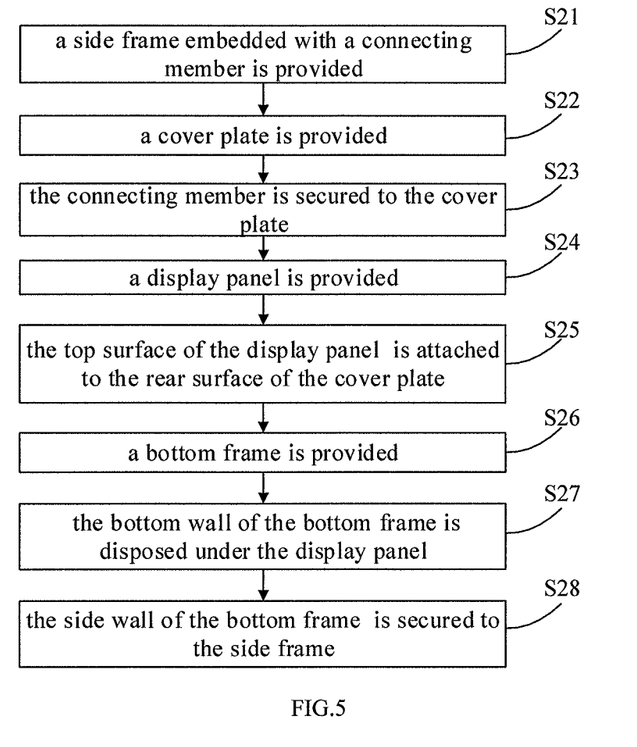
FIG. 5 is a flow chart showing a method for assembling the electronic device in accordance with an embodiment of the present disclosure.

FIG. 5 is a flow chart of a method for assembling the electronic device 100 according to an embodiment of the present disclosure. The method may include the follows.

In block S21, a side frame 18 embedded with a connecting member 19 is provided.

In block S22, a cover plate 16 is provided.

In block S23, the connecting member 19 is secured to the cover plate 16.

In block S24, a display panel 14 having a top surface 144 is provided.

In block S25, the top surface 144 of the display panel 14 is attached to the rear surface 162 of the cover plate 16.

In block S26, a bottom frame 12 having a bottom plate 122 and a side wall 124 is provided.

In block S27, the bottom plate 122 of the bottom frame 12 is disposed under the display panel 14.

In block S28, the side wall 124 of the bottom frame 12 is secured to the side frame 18.

In block S29, a back cover 20 is provided and mounted to the side frame 18.

The back cover 20 includes the bottom plate 24 and the side wall 26. The side wall 26 extends from the bottom plate 24. The inner surface of the side wall 26 defines a recess 22 therein. The protruding block 186 is inserted into the recess 22 thereby the side frame 18 being engaged with the back cover 20. The side wall 26 of the back cover 20 is mounted around the periphery of the side frame 18, the bottom plate 24 of the back cover 20 is opposite to the bottom plate 24 of the bottom frame 12, as FIG. 3 illustrates.

In the embodiments of the present disclosure, the sequence of the blocks is not limited. When the display assembly 10 is assembled, the back cover 100 can be mounted around the periphery of the display assembly 10.

In the embodiments of the present disclosure, the strength of the side frame 18 is increased, because the connecting member 19 is completely or partially embedded in the side frame 18 and connects the side frame 18 with the cover plate 16. The black coating 166 of the cover plate 16 can be narrower when the strength of the side frame 18 is increased, so the screen-to-body ratio of the display is increased and the user experience is improved.

While the present disclosure has been described in terms of what is presently considered to be the most practical and preferred embodiments, it is to be understood that the present disclosure needs not be limited to the disclosed embodiment. On the contrary, it is intended to cover various modifications and similar arrangements included within the spirit and scope of the appended claims which are to be accorded with the broadest interpretation to encompass all such modifications and similar structures.

What is claimed is:

1. A display assembly, comprising:
 a bottom frame comprising a bottom plate and a side wall bending from the bottom plate;
 a display panel comprising a top surface and a bottom surface, the bottom surface of the display panel being disposed on one surface of the bottom plate of the bottom frame away from the side wall;
 a cover plate comprising a rear surface, a front surface and a side surface, the side surface being connected between the rear surface and the front surface, the rear surface of the cover plate being attached to the top surface of the display panel;
 a side frame having an inner surface, the inner surface of the side frame being disposed adjacent to the side surface of the cover plate and secured to the side wall of the bottom frame; and
 a connecting member comprising an embedded portion and an extension portion extending from the embedded portion, the embedded portion being embedded in the side frame, the extension portion protruding from the inner surface of the side frame and disposed between the cover plate and the display panel.

2. The display assembly as claimed in claim 1, wherein the embedded portion is partially embedded in the side frame.

3. The display assembly as claimed in claim 1, wherein the insert portion comprises a relatively long part and a relatively short part, the relatively long part is exposed to an outer surface of the side frame, and the relative short part is embedded in the side frame.

4. The display assembly as claimed in claim 3, wherein the insert portion is L-shaped.

5. The display assembly as claimed in claim 1, wherein the embedded portion is wholly embedded in the side frame.

6. The display assembly as claimed in claim 1, wherein the side frame comprises a support wall and a rim, the support wall comprises a first portion and a second portion, the rim is arranged around the first portion, the inner surface of the first portion is attached to the side surface of the display panel.

7. The display assembly as claimed in claim 6, wherein the second portion is secured to the side wall of the bottom frame by any one or a combination of a gluing, a threaded connection, an engagement, and a welding method.

8. The display assembly as claimed in claim 6, wherein the side wall of the bottom frame defines a through hole therein, the second portion defines a threaded hole in the inner surface, at a position corresponding to the through hole in the side wall of the back cover, and the second portion and the side wall is fastened by a screw being inserted into the through hole and screwed into the threaded hole.

9. The display assembly as claimed in claim 1, wherein a black coating is formed on a peripheral edge of the rear surface of the cover plate by a screen printing method.

10. The display assembly as claimed in claim 1, wherein the connecting member is embedded in the side frame by means of an in-mold injection molding.

11. The display assembly as claimed in claim 1, wherein the connecting member is made of a rigid material.

12. The display assembly as claimed in claim 1, wherein the top surface of the display panel is fully laminated with the rear surface of the cover plate.

13. The display assembly as claimed in claim 1, wherein the top surface of the display panel is attached to the rear surface of the cover plate by an optically clear adhesive.

14. The display assembly as claimed in claim 13, wherein a thickness of the extension portion is smaller than the thickness of the optically clear adhesive.

15. The display assembly as claimed in claim 1, wherein the display panel comprises a display area and a non-display area surrounding the display area, the extension portion of the connecting member covers the non-display area.

16. An electronic device, comprising:
a display assembly comprising:
a bottom frame comprising a bottom plate and a side wall bending from the bottom plate;
a cover plate comprising a side surface;
a display panel disposed between the bottom plate and the cover plate;
a side frame comprising a first portion and a second portion, the first portion being disposed adjacent to the side surface of the cover plate, and the second portion being secured to the side wall of the bottom frame; and
a connecting member comprising an embedded portion and an extension portion extending from the embedded portion, the embedded portion being embedded in the side frame, the extension portion being attached between the cover plate and the display panel; and
a back cover being mounted around the periphery of the display assembly.

17. The electronic device as claimed in claim 16, wherein the back cover comprises a bottom plate and a side wall extending from the bottom plate, the side wall of the back cover is mounted around the periphery of the side frame, the bottom plate of the back cover is opposite to the bottom plate of the bottom frame.

18. The electronic device as claimed in claim 16, wherein the side wall comprises an inner surface, the inner surface defines a recess therein, the side frame comprises a protruding block protruding from an outer surface of the side frame, the protruding block is engaged in the recess.

19. A method for assembling a display assembly, comprising:
providing a cover plate and a side frame embedded with a connecting member, wherein the cover plate comprises a rear surface, the connecting member comprises an embedded portion and an extension portion bending from the embedded portion, the embedded portion is embedded in the side frame, and the extension portion protrudes from an inner surface of the side frame;
attaching the extension portion of the connecting member to the rear surface of the cover plate;
providing a display panel having a top surface and a bottom surface;
attaching the top surface of the display panel to the rear surface of the cover plate;
providing a bottom frame having a bottom plate and a side wall; and
disposing the bottom plate of the bottom frame under the display panel and securing the side wall of the bottom frame to the side frame,
wherein the extension portion is positioned partially between the display panel and the cover plate.

20. The method as claimed in claim 19, wherein the method further comprises:
providing a back cover and mounting the back cover to the side frame.

* * * * *